United States Patent [19]

Abe

[11] Patent Number: 4,812,678
[45] Date of Patent: Mar. 14, 1989

[54] EASILY TESTABLE SEMICONDUCTOR LSI DEVICE

[76] Inventor: Seiichi Abe, 8-11, Nishisakawa-1-chome, Odawara-shi, Japan

[21] Appl. No.: 29,096

[22] Filed: Mar. 23, 1987

[30] Foreign Application Priority Data

Mar. 22, 1986 [JP] Japan .................................. 61-64492

[51] Int. Cl.$^4$ ..................... H03K 17/56; H03K 17/16; G01R 31/28
[52] U.S. Cl. .................................... 307/443; 307/243; 307/465; 307/468; 371/24; 371/74
[58] Field of Search ............... 307/243, 443, 465, 468, 307/475; 371/24, 71

[56] References Cited

U.S. PATENT DOCUMENTS 4,561,094 12/1985 Vackowski et al. .................. 371/71

FOREIGN PATENT DOCUMENTS 0013597 7/1980 European Pat. Off. ............ 307/243
0100522 6/1982 Japan ..................................... 371/71

Primary Examiner—Stanley D. Miller
Assistant Examiner—M. R. Wambach
Attorney, Agent, or Firm—Antonelli, Terry & Wands

[57] ABSTRACT

In a large scale integrated (LSI) circuit, a through-passage circuit together with a selector circuit is provided between an input circuit and an output circuit, thereby enabling to selectively short-circuit the input circuit to the output circuit. In testing a complex circuit including two or more such LSIs, the internal circuit of the LSIs can be selectively extremely simplified to enable easy and fast testing.

15 Claims, 4 Drawing Sheets

EASILY TESTABLE SEMICONDUCTOR LSI DEVICE

BACKGROUND OF THE INVENTION

1. Field of the Invention

The present invention generally relates to a semiconductor device and more particularly to a semiconductor LSI device which can be easily tested when it is mounted on a circuit board.

2. Description of the Related Art

In general, semiconductor integrated circuit (IC) devices have to be tested after fabrication thereof for the purpose of checking whether the devices can operate in the manner for which they were designed. As the circuit configuration of the semiconductor IC device becomes more complicated with the integration density being increased, testing of the circuit operation of the device becomes more difficult. Consequently, preparation of test patterns for testing all the circuit functions requires very laborious and time consuming procedures. Under the circumstances, attempts have been made to realize IC circuit structures which can facilitate testing. By way of example, functional means are additionally incorporated which allow memory or storage elements included in a logic circuit to be set in desired states arbitrarily in response to signals applied externally or allow the states of the storage elements to be directly read out. A complicated logic circuit is separated into a group of storage elements and combinational logic circuits.

With a view to facilitating the testing of the combinational logic circuits, there has been proposed a so-called scan-path type circuit structure in which all flip-flops (latches) incorporated in a large scale IC or LSI are adapted to operate as shift registers upon testing of the LSI. Reference may be made to, for example, Japanese Patent Application Laid-Open No. 90270/1981 (JP-A-56-90270). In the case of this known circuit structure, such switching control means is provided which allows scan-in data applied to a plurality of signal terminals destined usually for data input/output to be directly set in a plurality of flip-flops while allowing the contents of the flip-flops to be directly transferred to the signal terminals to thereby realize a scan-out operation at a high speed.

It is however noted that no consideration has heretofore been paid to the testing or diagnosing a plurality of semiconductor LSI devices which are mounted or packed on a printed circuit board. This is because the logic scale of the circuit including a number of the semiconductor LSI devices mounted on the printed circuit board becomes very large, making it extremely difficult to prepare diagnosis patterns for testing the circuit, which requires an enormous amount of pattern data, giving rise to a problem.

For the reason mentioned above, a method has been extensively adopted according to which individual LSIs mounted on the printed circuit board are diagnosed with the aid of a so-called in-circuit tester. However, the test by using the in-circuit tester must be performed for each of LSIs individually and separately, involving time consuming labor. Besides, even when a defect in contact is present between a pin of an LSI and a wiring conductor on a printed circuit board, there is a possibility that such defect might not be detected because the pin might be pressed against the solder island on the printed circuit upon testing, whereby good contact is temporarily established. In that case, no contact failure is indicated, which is, of course another disadvantage.

In other words, although the printed circuit board having a plurality of LSIs mounted thereon should desirably be tested in the state as it is, there has been available no convenient method or means capable of conducting such test or diagnosis.

SUMMARY OF THE INVENTION

It is an object of the present invention to provide a semiconductor integrated circuit (IC) device which can be tested in a facilitated manner.

Another object of the present invention is to provide a semiconductor LSI structure in which a plurality of semiconductor LSIs can be easily tested while they are mounted on a single printed circuit board.

The invention starts from the fact that the diagnosis patterns can be simplified and decreased in number with the number of pattern preparation steps being decreased by reducing the logic scale of a semiconductor LSI device at the time of diagnosis.

According to a preferred embodiment of the present invention, there is provided a semiconductor LSI device including an input circuit, an output circuit and an internal logic circuit, which device further comprises a through-passage circuit connected in parallel with the internal logic circuit for transmitting signals of the input circuit to the output circuit, and a selector circuit for selecting either the output signals of the internal logic circuit or the output signals of the through-passage circuit. The selector circuit can select the output signals of the internal logic circuit in an ordinary operation while selecting the output signals of the through-passage circuit upon diagnosis or test of the semiconductor LSIs mounted on the circuit board. In this manner, the semiconductor LSI device can be operated on the basis of the logic of the through-passage circuit at the time of diagnosis. Consequently, the logic scale of the device as well as that of the circuit board having the device mounted thereon can be much reduced, which in turn means that the diagnosing patterns for testing the circuit board as a whole can be simplified. Thus, preparation of the diagnosis patterns for the circuit board can be facilitated while the number of steps for preparing the diagnosis patterns can be decreased. Besides, evaluation of the input circuit and the output circuit of the single semiconductor LSI device can also be facilitated because the logic scale of the semiconductor LSI device can be reduced at the time o evaluation.

In connection with the terminology used herein, it should be understood that the term "LSI" means a semiconductor device of an integration density not smaller than 50 elements per one pin, while the term "IC" means the semiconductor device of the integration density smaller than the abovementioned value.

DESCRIPTION OF THE PREFERRED EMBODIMENTS

Figure 1:
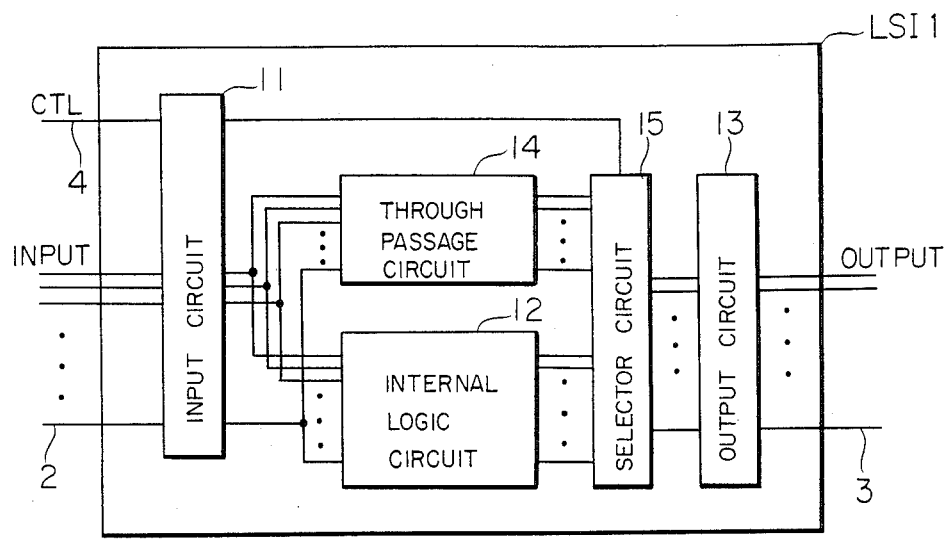
FIG. 1 is a circuit block diagram showing a semiconductor LSI device according to a basic embodiment of the present invention.

FIG. 1 shows a semiconductor LSI device according to a basic embodiment of the present invention. Referring to the figure, the LSI denoted generally by a reference numeral 1 includes an input circuit 11 for converting the level of input signals applied from an external unit to the level of internal signals, e.g. from TTL level to CMOS level, an internal logic circuit 12 for storing and otherwise logically processing the signals of the internal signal level, and an output circuit for converting the level of the output signals from the internal logic circuit 12 to the external signal level. Further, a through-passage circuit 14 is connected in parallel with the internal logic circuit 12 for interconnecting the input circuit 11 and the output circuit 13 in a short-circuit manner. Additionally, a selector circuit 15 is connected between the output circuit 13 and the parallel connection of the internal logic circuit 12 and the through-passage circuit 14 for selecting exclusively either the output signals of the internal logic circuit 12 or the output signals of the through-passage circuit 14 to be supplied to the output circuit 13. To this end, the selector circuit 15 is controlled by a control signal 4 for selectively connecting either the through-passage circuit 14 or the internal logic circuit 12 to the output circuit 13.

The internal logic circuit 12 includes a number of logic elements, memory or storage elements and the like and additionally may include a sequencer circuit such as a counter or the like whose operation depends on the chronographically preceding state. As a typical example of the internal logic circuit, there can be mentioned a gate array circuit.

The function of the through-passage circuit 14 is basically to transmit the input signal to the output terminal as it is. In this connection, it should be understood that inversion of all the signals means in substance logical equivalence to the intactness of all the signal and thus can be encompassed by the phrase "as it is" or "as they are". In the case where the number of the input terminals does not coincide with that of the output terminals, all the circuits can not be tested if any of terminals are left untested. Assuming, by way of example, that the input (or output) circuit is to be tested, connection must be formed to all the input (or output) terminals. To this end, the through-passage circuit may include a combinatorial logic circuit which assumes one output state determined definitely by one input state, regardless of the chronologically preceding state of the logic circuit. The through-passage circuit 14 is enabled to connect the input circuit 11 to the output circuit 13, (1) when operations of the input circuit and output circuit of the associated LSI are to be tested or (2) when test is to be performed for checking whether other parts of the circuit board to which the associated LSI is connected can operate normally or not.

Thus, the through-passage circuit has basically no relevance to the test of circuit functions of the LSI itself (functions of the internal logic circuit). Accordingly, it is sufficient that the complicated LSI circuit can be replaced by a simple logic circuit having preferably a simple combinational logic. The through-passage circuit thus has a significantly simpler logic than that of the internal logic circuit.

Since the test is performed for a device of such a scale which includes at least a plurality of LSIs, the pin contact failure and other defects of LSIs can be tested with high reliability.

In a typical device in which the internal logic circuit 12 includes tens to twenties of thousands of gates, the through-passage circuit usually contains 100 to 200 gates at most. Accordingly, the area occupied by the through-passage circuit as well as electric power consumed by the through-passage circuit is negligible when compared with the area and the power consumption of the LSIs.

In the case of the illustrated LSI 1, the control signal 4 is so set that the selector circuit 15 selects the output of the internal logic circuit 12 in the ordinary operation of the LSI. Accordingly, in the ordinary operation, the input signal 2 is reflected to the output signal 3 by way of the input circuit 11, the internal logic circuit 12, the selector circuit 15 and the output circuit 13. In other words, the illustrated LSI 1 operates similarly to the conventional LSI. For diagnosing the circuit board or device, the selector circuit 15 is so set as to select the output of the through-passage circuit under the command of the control signal 4. In that case, the input signal 2 is transmitted to the output side by way of the input circuit 11, the through-passage circuit 14, the selector circuit 15 and the output circuit 13. Consequently, the logic scale of the LSI is reduced significantly in the diagnosis of the circuit board.

Figure 2A:
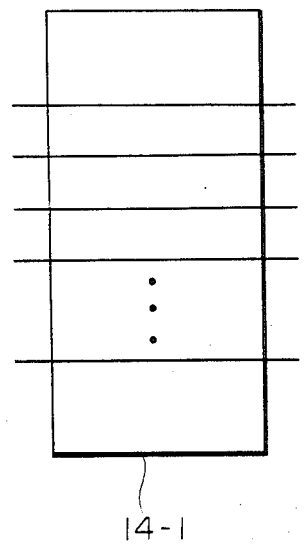
FIGS. 2A and 2B are circuit diagrams showing, respectively, basic structures of the through-passage circuit shown in FIG. 1.

FIG. 2A shows a typical embodiment of the through-passage circuit. In this through-passage circuit 14-1 shown in FIG. 2A, the input terminal is directly connected to the output terminal through an electrical conductor. In other words, each output terminal is provided in correspondence with each input terminal, wherein application of logic "1" signal to the input terminal results in appearance of the logic "1" signal at the corresponding output terminal.

Figure 2B:
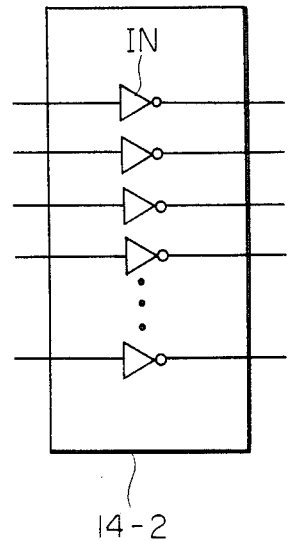

In the logical operation, all the signal levels may be inverted. FIG. 2B shows a through-passage circuit 14-2 which is so arranged that all the input signals are outputted after having been inverted. More specifically, each input terminal is connected to the associated output terminal through an inverter IN.

In LSI devices, the number of the input terminals does not always coincide with that of the output terminals. In such case, the through-passage circuits shown in FIGS. 2A and 2B are not suited for use.

Figure 3A:
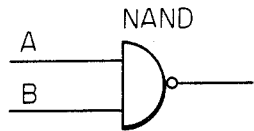
FIGS. 3A, 3B, 3C, 3D and 3E are circuit diagrams showing, respectively, those circuitries which can be employed to constitute a part of the through-passage circuit for the purpose of decreasing the number of signals when the number of input signals exceeds that of the output signals.
Figure 3B:
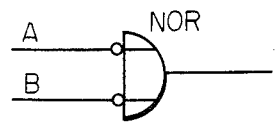

When the number of the input signals is greater than that of the output signals, it is desirable to reduce the number of the input signals down to that of the output signals. In this connection, it is noted that some of plural logic signals have often predetermined mutual relationship. By way of example, when a signal A does not assume logic "0" or logic "1" simultaneously with a signal B, circuit configurations shown in FIGS. 3A and 3B may be adopted for the purpose of decreasing the number of the input signals. Referring to FIG. 3A, the through-passage circuit includes a NAND circuitry labelled "NAND" which produces an output signal of logic "1" when only one of the input signals A and B is logic "1" while producing an output signal of logic "0" when both of the input signals are simultaneously logic "1". In the case of the circuit configuration shown in FIG. 3B which includes a NOR circuitry, the output signal of logic "1" is produced when only one of the signals A and B is logic "1", while the output signal of logic "0" is produced when both the signals A and B are simultaneously logic "1". Thus, the circuitries shown in FIGS. 3A and 3B are effective for decreasing the number of signals when the signals A and B do not simultaneously assume the logic level "0".

Figure 3C:
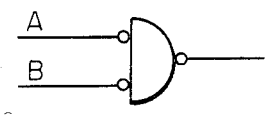
Figure 3D:
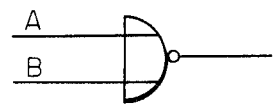

The circuitry shown in FIG. 3C is so arranged as to output a signal of logic "1" when only one of the input signals A and B is logic "0" and produce the output of logic "0" when both of the input signals A and B are simultaneously logic "0". On the other hand, in the case of a circuitry shown in FIG. 3D, the output signal of logic "0" is produced when only one of the signals A and B is logic "0", while the signal of logic "1" is produced when both signals A and B are simultaneously logic "0". Thus, the circuitries shown in FIGS. 3C and 3D are effective for decreasing the number of input signals when both signals A and B do not simultaneously assume the logic "1" level.

Figure 3E:
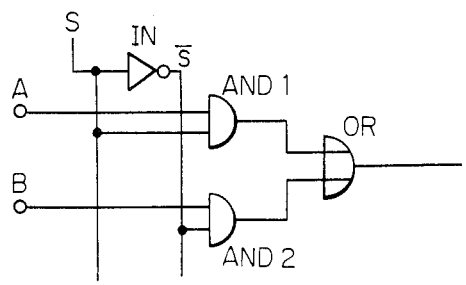

In the circuit arrangement shown in FIG. 3E, one of the signals A and B is selected in dependence on the status of a time sharing signal S. More specifically, when the signal S is logic "1", an AND circuitry AND 1 is enabled to select the signal A. On the other hand, when the signal S is logic "0", a signal $\overline{S}$ becomes logic "1" to enable an AND circuitry AND 2, whereby the signal B is selected.

The circuitries shown in FIGS. 3A, 3B, 3C, 3D and 3E can be employed as a part of the circuits shown in FIGS. 2A and 2B for the purpose of making the number of the input signals coincide with that of the output signals when the former is greater than the latter. The circuit configuration shown in FIG. 3E can advantageously be used when all the input signals are to be tested on the time-sharing basis.

When the number of the output signals is greater than that of the input signals, it is desirable that the number of the input signal be increased so as to coincide with that of the output signals for making it possible to test primarily the output circuit and to supply output signals to all the output terminals.

Figure 4A:
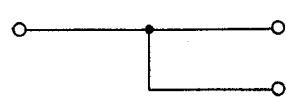
FIGS. 4A, 4B, 4C and 4D are circuit diagrams showing, respectively, those circuitries which can be employed as a part of the through-passage circuit for the purpose of increasing the number of signals when the number of output signals exceeds that of the input signals.
Figure 4B:
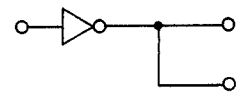
Figure 4C:
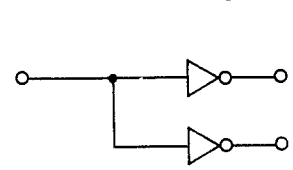

The circuitries shown in FIGS. 4A, 4B and 4C are designed simply to supply one input signal to the two output terminals. The circuitry shown in FIG. 4A is operative on the non-inverted logic basis while those shown in FIGS. 4B and 4C operate on the inverted logic basis.

Figure 4D:
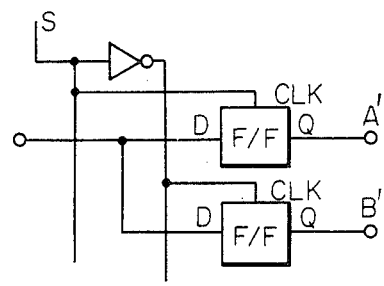

FIG. 4D shows a circuitry which is so configured as to create two types of signals A' and B' when one input signal varies as a function of time. This circuitry can be adopted advantageously when the test is to be performed by delaying the input signal.

Figure 5A:
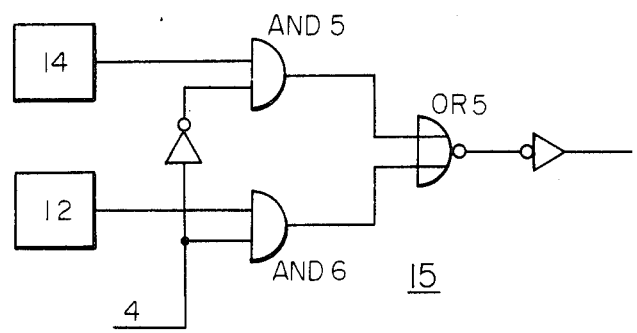
FIGS. 5A and 5B are circuit diagrams showing, respectively, typical configurations of the selector circuit shown in FIG. 1.
Figure 5B:
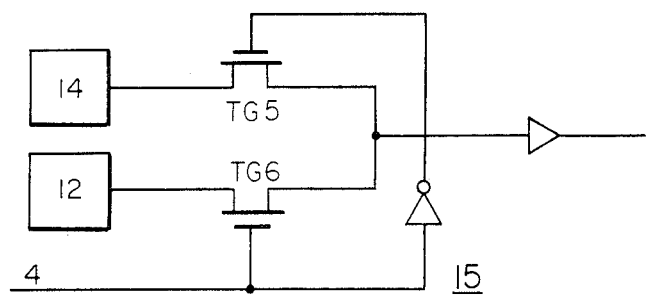

FIGS. 5A and 5B show exemplary arrangements of the selector circuit. In the case of the selector circuit shown in FIG. 5A, an AND circuit AND 5 has two inputs supplied with the output signals from the through-passage circuit 14 and the inverted control signal 4, to thereby produce an output signal of logic "1" when both input signals mentioned above are simultaneously logic "1", the output signal being supplied to an OR circuitry OR 5. The other AND circuitry AND 6 has two inputs supplied with an output signal of the internal logic circuit 12 and the control signal 4, to thereby produce an output signal of logic "1" when both input signals are simultaneously logic "1", the output signal being supplied to the OR circuitry OR 5. In other words, either the through-passage circuit 14 or the internal logic operation circuit 12 is selected in dependence on whether the control signal 4 is logic "0" or "1". FIG. 5B shows a circuit arrangement of the selector circuit which is composed of transfer gates TG 5 and TG 6 each constituted by a MOS FET. When the control signal 4 is "0", the transfer gate TG 5 is enabled while the transfer gate TG 6 is enabled when the control signal 4 is logic "1".

Figure 6:
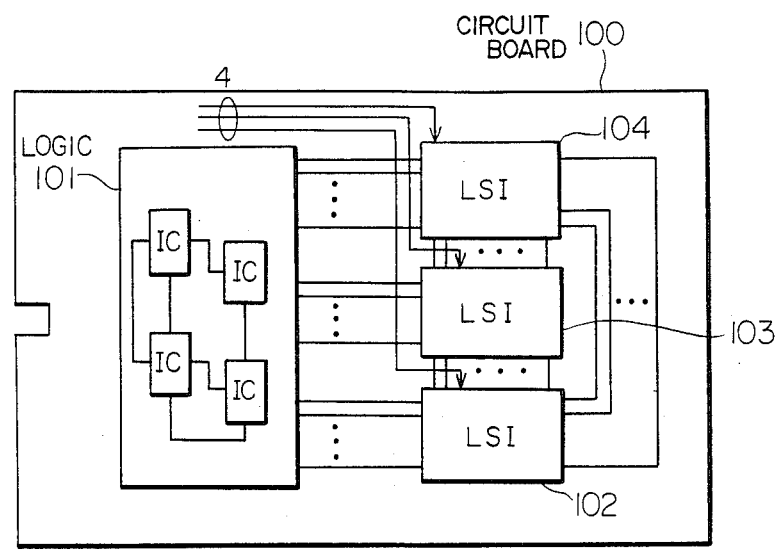
FIG. 6 is a schematic block diagram showing a typical arrangement of a circuit board having mounted thereon LSIs each having such a structure as shown in FIG. 1.
Figure 7:
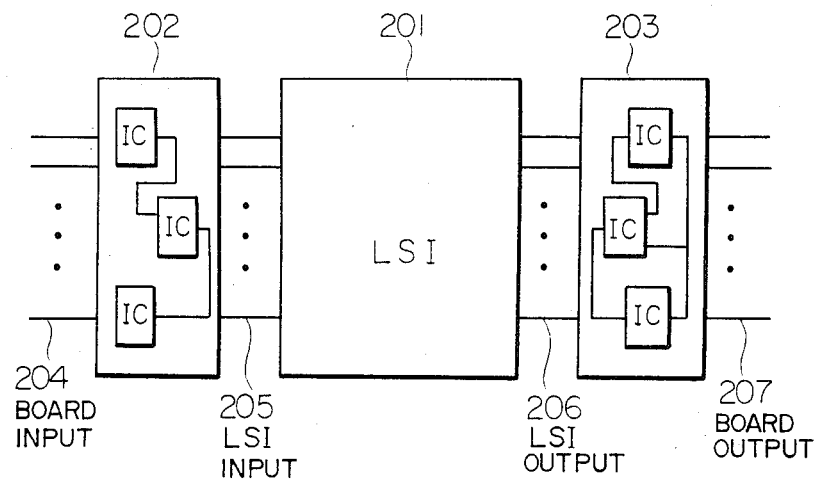
FIG. 7 is an equivalent circuit diagram of the circuit board shown in FIG. 6 in the state under test.

FIG. 6 shows in a block diagram a printed circuit board having mounted thereon LSIs each of a structure as shown in FIG. 1. FIG. 7 shows an equivalent circuit of the printed circuit board in the state under test.

In FIGS. 6 and 7, a reference numeral 100 denotes a circuit board on which LSIs are mounted, 101 denotes a logic circuit composed of ICs, numerals 102, 103, 104 and 201 denote the LSIs, 204 designates input signals to the circuit board, 205 designates input signals to an LSI, 206 designates output signals from the LSI and a reference numeral 207 designates output signals from the circuit board.

The circuit board 100 has the three LSIs 102, 103 and 104 and the logic circuit 101 composed of ICs. Upon diagnosing of the circuit board of the structure mentioned above, the control signal 4 is so set that in all of three LSIs, the output of the respective through-passage circuits 14 are selected. The circuit board 100 then assumes the logic configuration constituted only by the ICs. The circuit board thus logically simplified can be tested with a reduced number of simple diagnosis patterns to thereby check the wiring and the logic circuit 100 composed of the ICs as well as the input circuits 11 and the output circuits 13 of the LSIs 102, 103 and 104.

Next, the control signal 4 is so set that in only one of the LSIs, the output of the internal logic circuit 12 is selected while the outputs of the through-passage circuits 14 are selected in the remaining LSIs. Thus, the device 100 is equivalent to the circuit board having mounted thereon the logic circuits 202 and 203 each constructed by ICs and the LSI 201, as is illustrated in FIG. 7. In view of the fact that the LSI 201 contains several thousands to several ten thousands of gates and that each of the logic circuits 201 and 202 constituted by ICs contain in contrast several ten to several hundred gates, the whole circuit board can be diagnosed with patterns substantially corresponding to those required for diagnosing one LSI. The remaining LSIs can be similarly diagnosed, whereby the internal logics of all the LSIs can be checked. The LSI 201 may be combined with the IC blocks 202 and 203 to be handled as one LSI 201'.

As will now be understood, check of the wiring pattern of the circuit board, the input/output circuits of the LSIs and the logic circuits composed of ICs can be diagnosed with a decreased number of significantly simplified diagnosis patterns.

Moreover, the diagnosis patterns for the whole on-board circuits can be constituted by one pattern for diagnosing the logic circuit composed of ICs and three patterns for diagnosing the LSIs, respectively, whereby the diagnosis patterns can be significantly simplified when compared with the pattern required for diagnosing at one time a large scale logic such as the one constituted by three LSIs and a logic circuit composed of ICs.

In the case of a circuit board which has ICs and LSIs mounted on both surfaces and in which difficulty is encountered in testing with an in-circuit tester (a tester for diagnosing the printed circuit on a circuit board on the segment basis by placing a probe needle on pads formed at intermediate portions of the wiring conductors), the number of steps for preparing the diagnosis patterns can be decreased because the required diagnosis patterns are simple and can be reduced in number. Further, in the case of a circuit board in which ICs and LSIs are mounted on one surface, the diagnosis can be effectuated easily without resorting to the in-circuit tester, which in turn means that need for providing the pads for the tester can be eliminated, whereby miniaturization of the circuit board or device can be realized. It goes without saying that the diagnosis patterns to be utilized in combination with the in-circuit tester can be simplified and reduced in number to thereby allow the number of steps for preparing the diagnosis patterns to see significantly reduced when compared with the case of the conventional diagnosis patterns. It should further be mentioned that the invention can be equally applied to hybrid LSI chips and multi-chip LSI chips in addition to the circuit board described above.

I claim:

1. A semiconductor LSI device comprising:
   an input circuit for receiving external signals having a predetermined level from the exterior of said LSI device to convert said external signals to input signals having an operation level of internal circuits of said LSI device;
   an internal logic circuit connected to said input circuit for processing input signals supplied from said input circuit, said internal logic circuit including a sequencer logic;
   a through-passage circuit connected to said input circuit for processing input signals supplied from said input circuit in accordance with significantly simpler logic than that of said internal logic circuit;
   a selector circuit connected to said internal circuit and said through-passage circuit for selecting output signals of either one of said internal logic circuit or said through-passage circuit in accordance with a control signal supplied from the exterior of said LSI device; and
   an output circuit connected to said selector circuit for converting a level of output signals of said selector circuit to the level of the external signals.

2. A semiconductor LSI device according to claim 1, wherein said through-passage circuit passes as the output signals thereof the input signals from said input circuit as they are.

3. A semiconductor LSI device according to claim 1, wherein said through-passage circuit inverts the input signals from said input circuit to deliver the inverted signals as the output signals of said through-passage circuit.

4. A semiconductor LSI device according to claim 1, wherein said through-passage circuit executes combinatorial logic.

5. A semiconductor LSI device according to claim 2, wherein at least two output signals of said through-passage circuit correspond to one input signal from said input circuit.

6. A semiconductor LSI device according to claim 3, wherein at least two output signals of said through-passage circuit correspond to one input signal from said input circuit.

7. A semiconductor LSI device according to claim 4, wherein combinatorial logic operation of at least two input signals from said input circuit results in one output signal of said through-passage circuit.

8. A semiconductor LSI device according to claim 7, wherein other one of the input signals from said input circuit is produced as it is a one output signal of said through-passage circuit.

9. A semiconductor LSI device according to claim 7, wherein inversion of the other one of the input signals from said input circuit constitutes one output signal of said through-passage circuit.

10. A semiconductor LSI device according to claim 1, wherein said through-passage circuit includes a first circuit part for supplying one input signal from said input circuit alternately to two output terminals of said through-passage circuit and a second circuit part for processing other input signals from said input circuit in accordance with combinational logic to supply the resultant signals to other output terminals of said through-passage circuit.

11. A circuit device for integrally interconnecting a plurality of semiconductor LSI devices, wherein at least one of said semiconductor LSI devices comprises:
   an input circuit for receiving external signals having a predetermined level from the exterior of said LSI device to convert said external signals to input signals having an operation level of internal circuit of said LSI device;
   an internal logic circuit connected to said input circuit for processing said input signals supplied from said input circuit, said internal logic circuit including sequencer logic;
   a through-passage circuit connected to said input circuit for processing input signals supplied from said input circuit in accordance with significantly simpler logic than that of said internal logic circuit;
   a selector circuit connected to said internal logic circuit and said through-passage circuit for selecting output signals of either one of said internal logic circuit or said through-passage circuit in accordance with control signal supplied from the exterior of said LSI device; and
   an output circuit connected to said selector circuit for converting a level of output signals of said selector circuit to the level of the external signals.

12. A circuit device according to claim 11, wherein said through-passage circuit passes as the output signals thereof input signals from said input circuit as they are.

13. A circuit device according to claim 11, wherein said through-passage circuit invert the input signals from said input circuit to deliver the inverted signals as the output signals of said through-passage circuit.

14. An LSI diagnosis system having a plurality of sequentially connected semiconductor LSI devices each of which includes an internal logic circuit for logically processing input signals to output resultant signals, a through-passage circuit for outputting said input signals in a short-circuit manner without passing through said internal logic circuit, and a selector means for selecting either one of said internal logic circuit or said through-passage circuit, said system comprising:

means for supplying external signals to a predetermined one of said plurality of semiconductor LSI devices which has th internal logic circuit to be subjected to diagnosis thereof while selecting that internal logic circuit by said selector means; and means for supplying the external signals to the other semiconductor LSI devices while selecting the through-passage circuits thereof by said selector means.

15. A method of diagnosing a system having plural stages of interconnected semiconductor LSI devices each of which includes a input circuit for receiving diagnosis signals supplied from the exterior of the semiconductor LSI device for diagnosis of a internal logic circuit of the semiconductor LSI device, wherein said input circuit converts a level of said diagnosis signals to an operation level of internal circuits of the semiconductor LSI device, said internal logic circuit being connected to said input circuit for processing signals supplied from said input circuit, said internal logic circuit including a sequential logic, a through-passage circuit connected to said input circuit for processing the signals supplied from said input circuit in accordance with significantly simpler logic than that of said internal logic circuit, a selector circuit connected to said internal logic circuit and said through-passage circuit for detecting output signals of either one of said internal logic circuit or said through-passage circuit in accordance with a control signal supplied from the exterior of the semiconductor LSI device, and an output circuit connected to said selector circuit for converting output signals of said selector circuit to external signals of the semiconductor LSI device, said method comprising:

(a) a step of passing said diagnosis signals while sequentially selecting the output signals of the through-passage circuits of said semiconductor LSI devices by the selector circuits of said semiconductor LSI devices to the diagnosis, thereby diagnosing a state of interconnection between said semiconductor LSI devices;

(b) a step of passing said diagnosis signals while selecting the output signals of the internal logic circuit of any one of said semiconductor LSI devices selected for diagnosis by the selector circuit of that semiconductor LSI device and selecting the output signals of the through-passage circuits of the other semiconductor LSI devices by the selector circuits of those semiconductor LSI devices, thereby diagnosing the internal logic circuit of the selected semiconductor LSI device; and (c) a step of performing the diagnosis at said step (b) for all of said semiconductor LSI devices.

* * * * *

UNITED STATES PATENT AND TRADEMARK OFFICE
CERTIFICATE OF CORRECTION

PATENT NO. : 4,812,678

DATED : March 14, 1989

INVENTOR(S) : S. Abe

It is certified that error appears in the above-identified patent and that said Letters Patent is hereby corrected as shown below:

On the Title Page insert:

--Assignee: Hitachi, Ltd., Tokyo, Japan--

Signed and Sealed this

Twenty-fourth Day of December, 1991

Attest:

HARRY F. MANBECK, JR.

*Attesting Officer*  *Commissioner of Patents and Trademarks*